United States Patent [19]

Lewis et al.

[11] Patent Number: 4,623,601

[45] Date of Patent: Nov. 18, 1986

[54] PHOTOCONDUCTIVE DEVICE CONTAINING ZINC OXIDE TRANSPARENT CONDUCTIVE LAYER

[75] Inventors: Steven C. Lewis, Alhambra; Robert B. Love, Chatsworth; Stephen C. Miller, Simi Valley; Yuh-han Shing, Thousand Oaks; John W. Sibert, Venice; David P. Tanner, Thousand Oaks, all of Calif.; Nang T. Tran, Cottage Grove, Minn.

[73] Assignee: Atlantic Richfield Company, Los Angeles, Calif.

[21] Appl. No.: 740,945

[22] Filed: Jun. 4, 1985

[51] Int. Cl.$^4$ .............................................. G03G 5/082
[52] U.S. Cl. ........................................ 430/69; 430/84
[58] Field of Search .................. 430/69, 950, 63, 524, 430/527, 530, 84

[56] References Cited

U.S. PATENT DOCUMENTS 4,085,455  4/1978  Okumura .............................. 430/56
4,416,963  11/1983  Takimoto et al. .................... 430/69

Primary Examiner—John L. Goodrow
Attorney, Agent, or Firm—Nilsson, Robbins, Dalgarn, Berliner, Carson & Wurst

[57] ABSTRACT

A photoconductive device of decreased resistivity is provided by using at least one zinc oxide transparent conductive layer in conjunction with a thin film amorphous silicon photoconductor. The zinc oxide layer can be used as the front contact, the back contact or both the front and back contacts of the photoconductive device.

17 Claims, 2 Drawing Figures

PHOTOCONDUCTIVE DEVICE CONTAINING ZINC OXIDE TRANSPARENT CONDUCTIVE LAYER

BACKGROUND OF THE INVENTION

The present invention relates generally to the art of photoconductive devices and, more particularly, to a photoconductive device containing a zinc oxide transparent conductive layer.

Photoconductive devices generally consist of a photoconductor capable of generating an electrical potential upon being exposed to light and contacts which are effective to draw off any electric current which results from irradiation of the photoconductor. In most instances, such photoconductive devices also contain a suitable substrate such as glass, in order to provide protection from the environment and to serve as a base for the photoconductor. Many different photoconductive materials are known, such as silicon, germanium, gallium arsenide and copper indium diselenide, to name but a few. Photoconductors comprising silicon have obtained particularly wide usage because of their economy. Originally, single crystal silicon photoconductors were widely used. However, recently thin film alloys of silicon and hydrogen (TFS) have come to be preferred because of their lower cost and ease of fabrication. In particular, TFS layers have been utilized in photoconductors which incorporate a P-layer, an I-layer and an N-layer, which are known as P-I-N photoconductors. The I-layer, the intrinsic layer, is generally formed from a thin layer of microcrystalline or amorphous silicon alloyed with hydrogen or a silicon hydride. The P-layer is formed from silicon doped with boron or other dopant which will enable positive charge carriers, known as holes, to be produced at the interface between the P-layer and the I-layer. The N-layer is formed from silicon doped with phosphorous or other suitable material which will enable electrons to be separated at the interface between the N-layer and the I-layer. Contacts on the P-layer and the N-layer permit electric current to be drawn off into an external circuit for use therein. More recently, such contacts have taken the form of thin films, such as films of tin oxide or indium tin oxide, at least in the case of the front contact, that is the contact adjacent to the transparent substrate which may face or be distant from the incoming light rays. The back contact generally has been fabricated from various metals such as aluminum, silver, molybdenum, titanium or nickel. Such metals, however, are transparent to light rays only when they are applied in extremely thin layers. Tin oxide and indium tin oxide, on the other hand, are relatively transparent in reasonable thicknesses. However, even with such relatively conductive materials as the above-mentioned oxides, it has been found that a certain loss of electrical energy results in these layers. Moreover, such materials are fairly expensive.

It is accordingly an object of the present invention to provide a photoconductive device in which a relatively inexpensive transparent conductive layer or layers is utilized.

Another object of this invention is to provide a photoconductive device having desirable characteristics.

Other objects and advantages of the present invention will become apparent from the following detailed description.

SUMMARY OF THE INVENTION

The photoconductive devices of the present invention utilize at least one transparent conductive layer comprised of zinc oxide, which results in substantially lower electrical losses than in the photoconductive devices previously available. The photoconductive devices of this invention generally include a thin film silicon hydrogen photoconductor having at least one transparent conductive layer comprising zinc oxide having a resistivity in the range of about $10^{-4}$ to $10^{-2}$ ohm-centimeter. The zinc oxide layer or layers may contain hydrogen or group III elements as additives to provide various desired results. The transparent conductive zinc oxide layer may serve as either the front contact, back contact, or both the front and back contacts of the photoconductive device.

DESCRIPTION OF THE PREFERRED EMBODIMENTS

In general, the present invention relates to photoconductive devices in which a transparent conductive layer comprising zinc oxide is used as a contact layer for the photoconductor. Since the photoconductor is generally sandwiched between two sets of contacts it is possible to utilize zinc oxide as a transparent conductive layer forming one set of contacts or to utilize zinc oxide as both sets of contacts. In addition, it is possible to utilize zinc oxide as one contact and another transparent conductive layer such as tin oxide (TO) or indium tin oxide (ITO) as the other transparent conductive layer.

Figure 1:
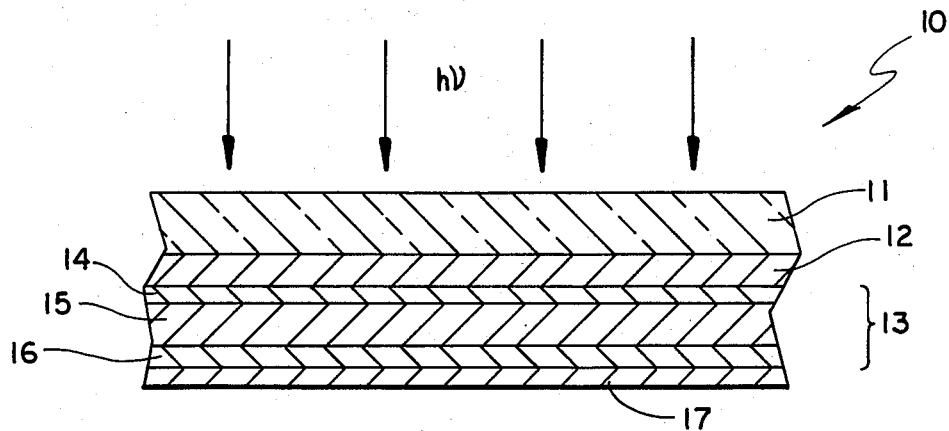
FIG. 1 of the drawings is an enlarged, fragmentary, cross-sectional view of a photoconductive device according to the present invention.

Turning now to FIG. 1 there is shown a photoconductive device 10 which consists of a substrate 11 such as glass, a transparent conductive layer 12 and a TFS layer 13. The amorphous silicon layer 13 consists of P-layer 14, I-layer 15 and N-layer 16. Adjacent layer 16 is a second transparent conductive layer 17.

Figure 2:
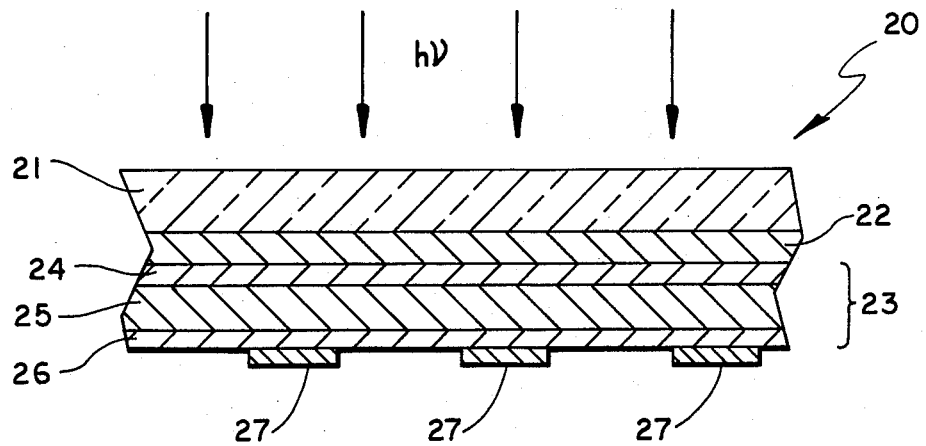
FIG. 2 is an enlarged, fragmentary, cross-sectional view of a second embodiment of a photoconductive device according to the present invention.

FIG. 2 illustrates another embodiment which is similar to FIG. 1. The numeral 20 represents the photoconductive device which consists of substrate 21, transparent conductive layer 22, and TFS layer 23, which consists of P-layer 24, I-layer 25 and N-layer 26. Photoconductive device 20 also contains metallic contacts 27 attached to N-layer 26.

With particular reference to FIG. 1, the substrate 11 can be any transparent insulating material such as glass or any suitable transparent plastic material. Glass is preferred because of its strength and desirable optical properties.

The transparent conductive layer 12 can be any conductive oxide, for example, zinc oxide, tin oxide or indium tin oxide. In a particularly preferred embodiment the transparent conductive layer is zinc oxide containing certain additives. Such additives as hydrogen or a group III element such as boron, aluminum, gallium, indium or thallium can be used, depending upon the resistivity and thermal properties desired. For example, zinc oxide containing hydrogen is less thermally stable than is zinc oxide containing aluminum, while zinc oxide containing aluminum has a somewhat higher resistivity than does zinc oxide containing hydrogen. Trace amounts of the additives are used, as will be pointed out more in detail below. The thickness of the transparent conductive layer can be about 100–60,000 angstroms.

The photoconductor 13 is shown as comprising three layers of semiconductive materials, namely, a P-layer, an I-layer and an N-layer. However, if desired, it is sufficent to provide a P-layer and an N-layer or to use a single layer in which a concentration gradient of dopant results in contributing P character and N character to various parts of the layer.

In the preferred embodiment shown in FIG. 1, P-layer 14 comprises boron-doped TFS, for example, a hydrogenated silicon-carbon alloy which is doped with boron. In this preferred embodiment, the P-layer can contain about 60 to 70 atomic percent silicon, about 20 atomic percent carbon, about 10 to 20 atomic percent hydrogen and a fraction of an atomic percent boron as a dopant. The thickness of the P-layer can vary between about 70 and 300 angstroms in the preferred embodiment.

The I-layer is composed of a silicon-hydrogen alloy which can contain about 85 to 95 atomic percent silicon and about 5 to 15 atomic percent hydrogen. The I-layer can be about 2500 to 7500 angstroms in thickness in a preferred embodiment.

The N-layer contains amorphous silicon containing phosphorous. This layer can contain about 85 to 95 atomic percent silicon, about 5 to 15 atomic percent hydrogen and a fraction of an atomic percent to a few atomic percent phosphorous. The thickness of the N-layer can be between about 200 and 800 angstroms in a preferred embodiment.

The back contact 17 can be a metal such as silver, nickel, aluminum, titanium or molybdenum, or a transparent conductive oxide such as zinc oxide, tin oxide or indium tin oxide. In a preferred embodiment, both the transparent conductive layer 12 and layer 17 comprise zinc oxide. Where the back contacts are metallic they can be about 1000 to 2000 angstroms thick. Where the back contact is a transparent conductive oxide the thickness of layer 17 can be about the same as that of layer 12, namely about 100–60,000 angstroms with about 2,000 to 15,000 angstroms being preferred.

The various photoconductive and other layers can be deposited upon the substrate by means of a glow discharge technique, sputtering or chemical vapor deposition. For example, a 100–60,000 angstrom layer of zinc oxide can be applied to a glass substrate by means of magnetron sputtering at low temperatures, for example, temperatures in the range of about 25° to 250° C. or at higher temperatures of up to about 500° C. if desired. Inclusion of the selected additive or additives is accomplished by use of a metallic target or by bleeding hydrogen or other gaseous additive into the argon stream used in sputtering.

The P-layer can be readily formed by introducing a mixture of silane, methane, and diborane into a glow discharge chamber in proportions to give the desired P-layer composition. The deposition occurs at a pressure of about 0.1–1.0 torr and at a temperature of about 150°–300° C. Deposition is continued for a sufficient period of time to deposit a layer of the desired thickness. A P-layer having a band-gap ($E_{04}$) between about 1.9 and 2.0 eV, a dark conductivity of about $10^{-6}$ inverse ohm-centimeters and a light conductivity of about $10^{-5}$ inverse ohm-centimeters can be obtained in this manner.

After the P-layer is deposited the glow discharge chamber is purged to avoid any contamination of the I-layer, which is deposited next.

Deposition of the I-layer is then accomplished by evacuating the chamber and back-filling with pure silane gas. Deposition then proceeds at a pressure of about 0.1–1.0 torr and a temperature of about 150°–300° C. Following deposition of the I-layer the chamber is pumped down and back-filled for deposition of the N-layer.

In order to deposit the desired silicon and phosphorous composition comprising the N-layer, silane and a mixture of phosphine in an inert gas are passed through the chamber at a pressure of about 0.1–1.0 torr and a temperature of about 150°–300° C.

The final step in fabrication of the photovoltaic devices of this invention is the deposition of the back electrode or back contact layer. The back contact, in the case of a metallized layer, can be applied by screen printing, sputtering or electron beam evaporation. In a preferred embodiment the back contact layer is a wide band-gap zinc oxide layer which is transparent at wavelengths in the visible range from 300 to 1300 nm. Zinc oxide can be readily deposited upon the photoconductor by sputtering to provide a transparent layer having a thickness in the range of about 100–60,000 angstroms at a pressure in the range of about 5 to 20 millitorr and at a temperature in the range of about 25° to 250° C. with about 2,000 to 15,000 angstroms being preferred. Where hydrogen inclusion is desired the hydrogen pressure should be in the range of about 0.01 to 0.08 millitorr with 0.04 millitorr preferred. Where aluminum inclusion is desired the aluminum content should be in the range of about 0.2–10 percent by weight with about 0.5–5 weight percent preferred. The resulting transparent conductive layer is highly conductive, having a resistivity in the range of about $10^{-4}$ to $10^{-2}$ ohm-centimeter. Where the zinc oxide contains hydrogen, the resulting ZnO(H) layer, which can be deposited at a temperature of about 25°–90° C., has been found to have a resistivity in the range of about $6 \times 10^{-4}$ to $1 \times 10^{-3}$ ohm-centimeter. A zinc oxide layer containing aluminum can be deposited at somewhat higher temperatures as well as at room temperature depending upon the method used. The ZnO(Al) layer has a resistivity of about $8 \times 10^{-4}$ to $1 \times 10^{-3}$ ohm-centimeter. It is also possible to include both hydrogen and aluminum in the zinc oxide. Hydrogen pressures in the range of about 0.01 to 0.08 millitorr and an aluminum content in the range of about 0.20 to 10 weight percent are suitable. A hydrogen pressure of about 0.04 millitorr and an aluminum content of about 0.5 to 5 weight percent are preferred. The ZnO(H,Al) layer displays a resistivity in the range of about $3 \times 10^{-4}$ to $6 \times 10^{-4}$ ohm-centimeter.

As pointed out above, the ZnO(H) layer is less temperature stable than the ZnO(Al) layer. The ZnO(H,Al) layer, which can be deposited at ambient temperatures, has been found to remain stable at temperatures of up to about 250° C. in air.

With all the zinc oxide layers and zinc oxide layers containing hydrogen or a group III element desscribed above, the transmittance of the layer has been found to be over 90 percent with a refractive index of about 2.0. A variety of photoconductive devices utilizing various combinations of front and back transparent conductive zinc oxide layers has been found to be effective. For example, the front contact can be ZnO(Al) and the back contact ZnO(H) and vice versa or both the front and back contacts can be ZnO(Al,H). A thin layer of tin or aluminum is sometimes deposited between the zinc oxide layer and semiconductor to improve prove contact with the TFS layer without damaging the optical properties thereof.

Use of the transparent conductive zinc oxide layers of the present invention has been found to provide photoconductive devices in which, due to the lower resistivity of these layers, the overall efficiency of the device is enhanced. For instance, solar cells having an efficiency of 7 percent or higher have been produced using the zinc oxide transparent conductive layers of this invention.

While certain specific embodiments of the invention have been disclosed as typical, the invention is, of course, not limited to these particular forms, but rather is applicable to all such variations as fall within the scope of the appended claims. For example, other group III additives than aluminum can be used to provide zinc oxide layers having desirable properties. In addition, as pointed out above, other photoconductors than the exemplified P-I-N photoconductor, for example an N-I-P photoconductor, can be used in the photoconductive devices of the present invention.

What is claimed is:

1. In a photoconductive device comprising a thin film silicon hydrogen alloy (TFS) photoconductor and front and back contacts, the improvement which comprises at least one of said front and back contacts being a transparent conductive layer consisting essentially of zinc oxide or zinc oxide containing hydrogen or zinc oxide containing a group III element or zinc oxide containing both hydrogen and a group III element, said transparent conductive layer havng a resistivity in the range of about $10^{-4}$ to $10^{-2}$ ohm-centimeter.

2. A photoconductive device according to claim 1 wherein said group III element is aluminum.

3. A photoconductive device according to claim 1 wherein said transparent conductive layer consists essentially of zinc oxide containing both hydrogen and aluminum and a thin layer of tin is deposited upon said transparent conductive layer.

4. A photoconductive device according to claim 1 wherein said transparent conductive layer is applied by sputtering.

5. A photoconductive device according to claim 1 wherein said transparent conductive layer is applied at a temperature of about 25° to 250° C. to a thickness of about 100–60,000 angstroms.

6. A photoconductive device according to claim 1 wherein said transparent conductive layer is applied at a temperature of about 25° to 250° C. to a thickness of about 2,000 to 15,000 angstroms.

7. A photoconductive device according to claim 1 wherein said transparent conductive layer consists essentially of zinc oxide containing hydrogen and is applied at a temperature in the range of about 25° to 90° C.

8. A photoconductive device according to claim 1 wherein said transparent conductive layer consists essentially of zinc oxide containing aluminum and is applied at a temperature in the range of about 25° to 250° C.

9. A photoconductive device according to claim 1 wherein said transparent conductive layer is applied at a pressure in the range of about 5 to 20 millitorr.

10. A photoconductive device according to claim 1 wherein said at least one of said front and back contacts is the front contact.

11. A photoconductive device according to claim 1 wherein said at least one of said front and back contacts is the back contact.

12. A photoconductive device according to claim 11 wherein the front contact comprises tin oxide or indium tin oxide.

13. A photoconductive device according to claim 1 wherein both the front and back contacts are transparent conductive layers consisting essentially of zinc oxide or zinc oxide containing hydrogen or zinc oxide containing a group III element or zinc oxide containing both hydrogen and a group III element and having resistivities in the range of about $10^{-4}$ to $10^{-2}$ ohm-centimeters.

14. A photoconductive device comprising a photoconductive film capable of generating an electrical potential uppon exposure to light, transparent conductive layers at the top and bottom of said film, at least one of said transparent conductive layers consisting essentially of zinc oxide or zinc oxide containing hydrogen or zinc oxide containing a group III element or zinc oxide containing both hydrogen and a group III element, said at least one transparent conductive layer having a resistivity in the range of about $10^{-4}$ to $10^{-2}$ ohm-centimeter, and contacts connected to said transparent conductive layers for connecting the photoconductive device to an external circuit.

15. A process for the production of a photoconductive device which comprises:
    applying a first transparent conductive layer to a transparent insulating substrate;
    applying a thin film amorphous semiconductive layer to said first transparent conductive layer; and
    applying a second transparent conductive layer to said thin film amorphous semiconductive layer;
    at least one of said first and second transparent conductive layers consisting essentially of zinc oxide or zinc oxide containing hydrogen or zinc oxide containing a group III element or zinc oxide containing both hydrogen and a group III element havng a resistivity in the range of about $10^{-4}$ to $10^{-2}$ ohm-centimeter.

16. A process according to claim 15 wherein said first transparent conductive layer is tin oxide or indium tin oxide and said second transparent conductive layer consists essentially of zinc oxide or zinc oxide containing hydrogen or zinc oxide containing a group III element or zinc oxide containing both hydrogen and a group III element and having resistivity in the range of about $10^{-4}$ to $10^{-2}$ ohm-centimeter.

17. A process according to claim 15 wherein both of said first and second transparent conductive layers consist essentially of zinc oxide or zinc oxide containing hydrogen or zinc oxide containing a group III element or zinc oxide containing both hydrogen and a group III element and having resistivities in the range of about $10^{-4}$ to $10^{-2}$ ohm-centimeter.

* * * * *